(12) United States Patent
Aernouts et al.

(10) Patent No.: US 8,216,633 B2
(45) Date of Patent: Jul. 10, 2012

(54) METHOD FOR THE PRODUCTION OF A LAYER OF ORGANIC MATERIAL

(75) Inventors: Tom Aernouts, Hulshout (BE); Frederik Christian Krebs, Lyngby (DK); Peter Vanlaeke, Boutersem (BE)

(73) Assignees: IMEC, Leuven (BE); Universiteit Hasselt, Diepenbeek (BE); Katholieke Universiteit Leuven, K.U. Leuven R&D, Leuven (BE)

(*) Notice: Subject to any disclaimer, the term of this patent is extended or adjusted under 35 U.S.C. 154(b) by 798 days.

(21) Appl. No.: 12/299,765

(22) PCT Filed: May 21, 2007

(86) PCT No.: PCT/EP2007/004491
§ 371 (c)(1),
(2), (4) Date: Mar. 4, 2009

(87) PCT Pub. No.: WO2007/134823
PCT Pub. Date: Nov. 29, 2007

(65) Prior Publication Data
US 2009/0173937 A1    Jul. 9, 2009

(30) Foreign Application Priority Data

May 19, 2006  (WO) ................. PCT/EP2006/004768

(51) Int. Cl.
*B05D 5/06* (2006.01)
(52) U.S. Cl. ............................. 427/64; 427/99
(58) Field of Classification Search .................. 427/64; 438/99
See application file for complete search history.

(56) References Cited

U.S. PATENT DOCUMENTS 5,569,058 A * 10/1996 Gnade et al. .................. 445/24
6,645,851 B1 * 11/2003 Ho et al. ....................... 438/626
(Continued)

FOREIGN PATENT DOCUMENTS
WO   WO 03/007399 A2   1/2003
(Continued)

OTHER PUBLICATIONS

Aernouts, et al. Polymer solar cells: screen-printing as a novel deposition technique. Organic Optoelectronics and Photonics, Proceedings of SPIE vol. 5464 (SPIE, Bellingham, WA, 2004).

(Continued)

*Primary Examiner* — Michael Cleveland
*Assistant Examiner* — Robert Vetere
(74) *Attorney, Agent, or Firm* — Knobbe Martens Olson & Bear LLP

(57) ABSTRACT

The present invention provides a method for producing a layer of organic material. The method comprises
  providing onto a substrate, under deposition conditions, a layer of a solution comprising said organic material dissolved in a solvent; optionally partially drying said layer of solution; thereafter
  annealing said layer of solution, said annealing being applied before said layer of solution has been dried out completely and the duration of said annealing being limited such that said layer of solution is not dried out completely during the annealing, said annealing inducing reflow of said layer of solution; and
  thereafter drying out said layer of solution, said drying out being controlled such that it is performed slower than it would be under deposition conditions.

The resulting layer of organic material shows an improvement of both the micro quality and the macro quality, leading to obtaining a fully continuous film with minor surface roughness and an accurate line resolution and edge definition.

24 Claims, 2 Drawing Sheets

U.S. PATENT DOCUMENTS

| | | | |
|---|---|---|---|
| 2002/0013013 A1* | 1/2002 | Victor et al. | 438/57 |
| 2004/0097005 A1* | 5/2004 | Daniels | 438/99 |
| 2005/0124784 A1* | 6/2005 | Sotzing | 528/380 |
| 2005/0276910 A1* | 12/2005 | Gupta | 427/66 |
| 2006/0078761 A1* | 4/2006 | Williams et al. | 428/690 |
| 2006/0207457 A1* | 9/2006 | Rogojevic et al. | 101/454 |

FOREIGN PATENT DOCUMENTS

WO     WO03/007399 A2 *    1/2003

OTHER PUBLICATIONS

Kim, Youngkyoo, et al. Device annealing effect in organic solar cells with blends of regioregular poly(3-hexylthiophene) and soluble fullerene. Applied Physics Letters 86, 063502 (2005).

Vanlaeke, P., et al. P3HT/PCBM bulk heterojunction solar cells: Relation between morphology and electro-optical characteristics. Solar Energy Materials & Solar Cells 90 (2006) 2150-2158.

* cited by examiner

METHOD FOR THE PRODUCTION OF A LAYER OF ORGANIC MATERIAL

CROSS-REFERENCE TO RELATED APPLICATIONS

This application is the national phase under 35 U.S.C. §371 of PCT International Application No. PCT/EP2007/004491 which has an International filing date of May 21, 2007, which designates the United States of America and which claims priority to PCT International Application No. PCT/EP2006/004768, filed May 19, 2006, the disclosures of which are hereby expressly incorporated by reference in their entirety and are hereby expressly made a portion of this application.

FIELD OF THE INVENTION

The present invention relates to the field of organic materials and more in particular to a method for producing a layer of organic material, for example for use in photovoltaic applications.

BACKGROUND OF THE INVENTION

Photovoltaic applications based on organic materials are known from numerous publications. More specifically a device concept in which the photovoltaic active layer comprises a mixture of an electron donating and an electron accepting material sandwiched between two electrodes is attracting much attention.

Compounds forming such a mixture for the photovoltaic active layer are manifold. Well-known electron acceptor materials are fullerenes and/or fullerene derivatives. However, other materials like, for example, cyano-substituted conjugated polymers or perylene based small molecules are also considered as electron acceptors. Well-known electron donating materials are conjugated polymers like, for example, poly(phenylene-vinylene)s, poly(fluorene)s, poly(thienylene-vinylene)s or poly(thiophene)s. However, other organic polymers as well as numerous organic materials comprising small molecules are also considered as electron donating materials.

Many material combinations are therefore studied but mixtures involving polymeric materials are attracting much attention because they are assumed to be more suitable for large area processing.

A combination of poly(thiophene) polymers with fullerene derivatives as photovoltaic active layer is well-known. Especially the ability of having regioregular poly(thiophene) incorporated in the active compound mixture can lead to a better overlap of the optical absorption characteristics of the photovoltaic active layer with the solar spectrum. An increase of the light absorption in such a photovoltaic active layer has been described to be beneficial for the performance of the final solar cell. Such an increase can be achieved by incorporating an additional treatment into the device production process, as for example shown in "Effects of Postproduction Treatment on Plastic Solar Cells", Franz Padinger et al., Adv. Funct. Mater. 2003, 13, No. 1, January, wherein organic solar cells are treated (after the deposition of the top electrode) simultaneously with an applied external potential higher than the open circuit voltage and a temperature higher than the polythiophene glass transition temperature. Another example of an additional treatment leading to an increased absorption is described in WO 2004/025746, the treatment comprising exposing the photovoltaic active layer to a solvent vapour at room temperature or annealing the active layer at a temperature of at least 70° C. These treatments are applied after finalizing the deposition of the active layer. In "Device annealing effect in organic solar cells with blends of region-regular poly(3-hexylthiophene) and soluble fullerene", Youngkyoo et al., Applied Physics Letters 86, 063502 (2005) an enhanced efficiency and an increase of the light absorption of bulk heterojunction solar cells is observed after annealing at 140° C.

Since the photovoltaic active layer of these devices generally has a thickness below 1 micrometer and is sandwiched in between two metallic contacts or contact layers, high accuracy on the deposition of this layer is required. Especially the need to achieve a fully continuous film between the electrodes with a well-controlled thickness and minor surface roughness is high.

A high degree of film continuity and uniformity may generally be achieved by solution processing via spin coating, whereby the compounds are dissolved in a solvent or a mixture of solvents. Several processing drawbacks can however be associated with this coating technique, such as for example high material consumption and limited substrate sizes. The application of linear casting techniques such as, for example, doctor blading or roll-casting can overcome these problems. However, these techniques still lack the possibility of direct patterning of the deposited layer. Direct patterning can for example be beneficial for integration of photovoltaic structures into larger applications or to produce monolithic modules of photovoltaic devices. Patterning of the deposited layer offers the possibility to construct several photovoltaic devices onto a single substrate to be connected with each other. Printing techniques such as, for example, inkjet printing, screen printing, gravure printing, flexographic printing or offset printing can resolve these process limitations. The above mentioned different deposition techniques have rather diverse requirements with respect to the physical properties of the solution comprising the active layer compounds. For some of them it is for example more appropriate to have a low viscosity of the solution whereas other deposition techniques require high viscosity levels.

It is not obvious with these printing techniques to deposit a photovoltaic active layer with limited thickness (e.g. 1 micrometer or less) and to achieve at the same time the required high quality of a fully continuous film with minor surface roughness. Moreover, for a good integration of the photovoltaic structures into other applications or to construct onto a single substrate several photovoltaic devices to be connected with each other, accurate line resolution and edge definition are required.

In US2005/0276910 a method is described to improve the thickness uniformity of organic layers. The drying profile of a deposited organic solution is modified by post-processing the dried film in a high temperature and/or high humidity post-processing environment. The post-processing induces a reflow of the organic material to fill in any defects and thereby creates a more uniform and flatter film profile. Alternatively, after deposition of the organic solution, and as it is drying, a treatment comprising exposure to a high temperature and/or high humidity may be performed. Patterning of the organic layers is obtained by means of photoresist lines or bank structures.

SUMMARY OF THE INVENTION

It is an aim of the present invention to provide a method for producing an organic layer that may be used e.g. as a photoactive layer in organic photovoltaic devices, which alleviates or avoids the problems of the prior art. The deposition of an organic layer according to the present invention may be performed by a linear technique, a linear casting or a linear printing technique. When applying a method in accordance with embodiments of the present invention, the required high quality of a fully continuous film with minor surface roughness may be obtained. Moreover, the line resolution and edge definition of the directly patterned film may be substantially improved as compared to prior art solutions. Any method according to the present invention may furthermore be combined with additional treatments of the organic layer to optimize the performance of a photovoltaic device comprising such an organic layer as active layer.

The aim is achieved by performing an annealing step on a layer of a solution comprising an organic material dissolved in a solvent, before this layer is dried out. This annealing step may be performed at a temperature above the deposition temperature of the solution and below the boiling temperature of the solvent, and is limited in time (e.g. less than 60 seconds) such that the layer is not completely dried out during annealing. Annealing may cause a decrease of the viscosity of the layer, such that it may reflow, leading to a substantial improvement of the surface roughness and the edge definition as compared to the case where no such annealing step is performed. Furthermore drying out of the layer after the annealing step may be controlled such that drying is performed slower than it would be under deposition conditions, leading to an increase of the light absorption in the organic layer and an enhanced efficiency of a photovoltaic device comprising such an organic layer as active layer.

A method for producing a layer of organic material according to embodiments of the present invention comprises providing onto a substrate, under deposition conditions, a layer of a solution comprising the organic material dissolved in a solvent; annealing the layer of solution, the annealing being applied before the layer of solution has been dried out completely and the duration of the annealing being limited such that the layer of solution is not dried out completely during the annealing, whereby annealing induces reflow of the layer of solution; and thereafter drying out the layer of solution, the drying out being controlled such that it is performed slower than it would be under deposition conditions. The layer of solution not being dried out completely means that the solvent or part of the solvent is still present in the layer. The layer of solution not being dried out completely includes the layer being reflowed and solidified although solvent or part of the solvent is still present in the layer. In comparison, drying out the layer of solution means substantially completely removing the solvent from the layer, for example by evaporation.

In embodiments according to the present invention, annealing the layer of solution may be performed at a temperature above the temperature corresponding to the deposition conditions and below the boiling temperature of the solvent, for example up to 99%, 90%, 80%, 70%, 60%, 50%, 40%, 30% or 20% of the boiling temperature in degrees Celcius of the solvent. The duration of the annealing may for example be less than 60 seconds, less than 30 seconds or less than 10 seconds.

In a preferred embodiment, drying out the layer of solution may be performed at a temperature corresponding to the deposition conditions or at room temperature, for example at a temperature between 20° C. and 25° C. Furthermore, drying out the layer of solution may be performed in a saturated atmosphere, e.g. an atmosphere saturated with the solvent. In preferred embodiments of the present invention, the temperature at which the layer is dried out is substantially lower than the temperature at which the annealing step is performed, and the duration of the drying step is substantially longer than the duration of the annealing step.

In embodiments of the present invention, providing a layer of a solution comprising the organic material dissolved in a solvent may comprise providing a solution with a viscosity that is sufficiently high to prevent bleed through of the solution in a screen printing process, for example a viscosity higher than 0.5 Pa·s, and applying the solution onto the substrate. In another embodiment of the present invention, providing a layer of a solution comprising the organic material dissolved in a solvent may comprise dissolving the organic material in the solvent, waiting until the solution attains a viscosity high enough to prevent bleed through of the solution in a screen printing process, for example a viscosity higher than 0.5 Pa·s, and applying the solution onto the substrate.

In embodiments according to the present invention, a solution with a ratio of weight of organic material per volume of solution in the range between 0.5% and 15% may be provided.

The layer of solution may be provided onto the substrate by means of a linear technique, such as for example a doctor-blading technique or a roll-casting technique or a printing technique.

The method according to embodiments of the present invention may furthermore comprise partially drying the layer of solution, between the step of providing the layer of solution onto the substrate and the step of annealing the layer of solution. The method according to embodiments of the present invention may furthermore comprise partially drying the layer of solution to thereby solidify the layer between the step of providing the layer of solution onto the substrate and the step of annealing the layer of solution. By solidify is meant that the layer is stable, e.g. as to lateral spreading.

The organic material may for example be a conjugated polymer, a regioregular material, or a poly(thiophene). The organic material may further comprise fullerenes and/or fullerene derivatives, conjugated additives or no-conjugated additives.

The solvent may for example comprise tetralin. The solvent may be a mixture of solvents.

In embodiments according to the present invention, the method may furthermore comprise providing the substrate, onto which thereafter the layer of a solution comprising said organic material dissolved in a solvent is provided. Providing a substrate may comprise providing a substrate comprising first electrodes, and the method may further comprise, after drying out the layer of solution, providing second electrodes on top of the layer of organic material.

The method according to embodiments of the present invention may be used for the production of an organic layer as part of, for example, a photovoltaic cell, a light-emitting diode, a photodetector, a transistor, a laser or a memory element.

DETAILED DESCRIPTION OF THE INVENTION

Figure 1:
FIG. 1 illustrates films, after full evaporation of the solvent, of P3HT, screen printed onto a substrate (a) without annealing step (reflow), in accordance with prior art methods, and (b) with annealing step (reflow) in accordance with embodiments of the present invention, the annealing step having a duration of 2 seconds at a temperature of 100° C.
Figure 1:
Figure 1:
Figure 1:
Figure 1:
Figure 1:

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

A method for producing a layer of organic material according to embodiments of the present invention comprises providing on a substrate, under deposition conditions, a layer of a solution comprising an organic material dissolved in a solvent or in a mixture of solvents, annealing the layer before it has dried completely, the duration of the annealing being controlled such that the layer of the solution is not dried out completely during the annealing, and thereafter drying the layer in a controlled way, such that drying is performed slower than it would be under deposition conditions. Not drying out completely can include reflowing and solidifying the layer without removing all the solvent. Optionally the layer may be dried partially before performing the annealing step.

In embodiments of the present invention, the term "substrate" may include any underlying material or materials that may be used, or upon which a device, a circuit or an epitaxial layer may be formed. The substrate can be transparent, semi-transparent or opaque. The substrate can comprise glass, quartz, semiconductors (such as silicon, germanium, gallium arsenide, and the like), metals (such as platinum, gold, palladium, indium, silver, copper aluminium, zinc, chromium nickel, and the like), stainless steel, plastic. The substrate may include, for example, an insulating layer such as $SiO_2$ or a $Si_3N_4$ layer in addition to the previously described substrate materials. The substrate may include in addition to the previously described substrate materials electrode materials like metals (such as platinum, gold, palladium, indium, silver, copper aluminium, zinc, chromium nickel, and the like), metal oxides (such as lead oxide, tin oxide, indium tin oxide, and the like), graphite, doped inorganic semiconductors (such as silicon, germanium, gallium arsenide, and the like) and doped conducting polymers (such as polyaniline, polypyrrole, polythiophene, and the like). The term "substrate" is thus used to define generally the elements for layers that underlie a layer or portions of interest. Also, the "substrate" may be any other base on which a layer is formed, for example a glass or metal layer.

Providing the layer of a solution comprising an organic material dissolved in a solvent or a mixture of solvents on a substrate may preferably be performed by means of a linear technique, such as for example a linear casting technique or a linear printing technique. In preferred embodiments the linear technique is a doctor-blading technique, a dip coating technique, a web coating technique, a spray coating technique or a roll-casting technique or a printing technique such as, but not limited to, inkjet printing, screen printing, gravure printing, flexographic printing, offset printing. Such printing techniques can, and preferably do, produce a pattern comprising a top surface and side surfaces, i.e. a three-dimensional pattern.

Deposition conditions can for example be normal atmospheric conditions such as e.g. deposition in air at atmospheric pressure and room temperature, e.g. a temperature between 20° C. and 25° C. Deposition can e.g. also be performed in an $N_2$ atmosphere at atmospheric pressure and room temperature. Other deposition conditions, for example deposition under another atmosphere, at non-atmospheric pressure or at other deposition temperatures may be used.

The annealing step according to the present invention reduces the viscosity of the solution comprising an organic material dissolved in a solvent and thereby induces reflow of the layer. "Reflow" may be defined as the redistribution of material on the deposition surface i.e. the substrate. Annealing is performed preferably right away or as soon as possible after the deposition of the layer onto the substrate and before the solvent has completely evaporated from the deposited layer. It can, however, be performed as long as the layer is not completely dried out. The reflowing or annealing may comprise a temperature increase to a temperature preferably above the deposition temperature, and up to any temperature lower than the boiling point of the solvent or mixture of solvents, e.g. up to 99%, 90%, 80%, 70%, 60%, 50%, 40%, 30%, 20% of the boiling point temperature in degrees Celcius of the solvent. It is advantageous to keep the annealing step as short as possible, i.e. sufficient to cause the layer to reflow, but substantially not longer, such that the layer comprising the organic material is not dried out completely during annealing. In preferred embodiments, the annealing step is performed during less than 60 seconds, preferably less than 30 seconds, still more preferred less than 10 seconds. In more preferred embodiments, the annealing step is performed during a time period not longer than a few seconds, preferably between 0.1 and 10 seconds. The optimum duration of the reflow step or annealing step is dependent on a number of factors, such as for example the chemical and physical properties (e.g. boiling point, viscosity, . . . ) of the solution comprising the organic material and the solvent under reflow, and the environmental conditions during reflow, such as temperature, humidity and pressure conditions, and can be determined by experimentation. In a preferred embodiment annealing may be done at atmospheric pressure, for example in air or in a $N_2$ atmosphere. The duration of the reflow is of course dependent on the temperature increase during annealing: the higher the temperature increase, the faster the layer of organic material will dry out, and the shorter the reflow step or annealing step may be. It is preferable to have a shorter reflow step at higher temperature, rather than a longer reflow step at lower temperature. It is preferable to have a higher reflow temperature rather than a lower reflow temperature. The duration of the reflow is of course also dependent on the humidity: the larger the humidity, the faster the layer of organic material will reflow In view of the limited duration of the annealing step, it does not interfere with additional treatments of for example an organic photovoltaic active layer to optimize the performance of the final photovoltaic device.

The reflow or annealing step can be such that an already partially crystallised organic film, i.e. where the polymer chains are partially lined up in ordered crystals, is again transformed into an amorphous film, i.e. where the polymer chains have no ordered arrangement. Preferably, the reflow is performed as early as possible after deposition of the layer, in order to be able to change the roughness thereof, preferably immediately after deposition of the layer.

An annealing step or reflow step in accordance with the present invention considerably improves the macro quality of the organic layer or organic film, leading to obtaining a fully continuous film with minor surface roughness and an accurate line resolution and edge definition. The "macro quality" is a measure for the surface roughness, the line resolution accuracy and the edge definition. The surface roughness of a film can be defined as the average distance (average of the absolute values) of a line drawn along the surface of the film from the intended surface of the film. The surface roughness of a layer of organic material produced according to embodiments of the present invention may be less than 10%, less than 5% or less than 1% of the film thickness. The edge definition of a film can be defined as the average distance (absolute values) of a line drawn along the edge of a pattern from the intended edge of the pattern. The edge definition of a layer of organic material produced according to embodiments of the present invention may be below 1 mm, below 100 micrometer, below 10 micrometer, below 1 micrometer.

After the annealing step, according to embodiments of the present invention, the layer is further dried in a controlled way, i.e. in such a manner that the drying is slowed down as compared to drying under the deposition conditions. Slower drying of the film may result in a better micro quality of the film. Controlling the dry-out time of the layer can advantageously be performed by reducing the evaporation speed of the solvent, when compared to the evaporation speed of the solvent at deposition conditions. This may be obtained by changing the conditions for drying with respect to the deposition conditions, such as e.g. changing one or more of the environmental parameters such as the drying temperature (e.g. drying temperature lower than the deposition temperature), the drying pressure (e.g. drying pressure higher than the deposition pressure), the humidity of the environment or performing drying in a saturated atmosphere. In a preferred embodiment drying the layer may be performed at atmospheric pressure and at room temperature, e.g. at a temperature between 20° C. and 25° C., and in a saturated atmosphere, e.g. an atmosphere saturated with the solvent.

The dry-out time of the layer or the evaporation time of the solvent may also be controlled by selecting for example a linear technique, for example a linear casting technique. With linear casting techniques the deposition step and the drying step are typically separate and sequential steps, while with a classical spin-on technique the deposition step and the drying step are at least partially occurring simultaneously.

The drying step performed after the annealing step may preferably follow a predetermined drying scheme, comprising at least 1 deceleration of the evaporation of the solvent (as compared to evaporation under deposition conditions), and thus deceleration of the dry-out of the film as compared to dry-out under deposition conditions. The at least 1 deceleration may optionally also be followed by a number (1 or more) of accelerations and decelerations. The drying scheme may be determined such that the micro quality of the layer is optimised. The micro quality of a layer is related to the internal microstructure of the layer, i.e. how molecules align. A high micro quality corresponds to a high degree of alignment of molecules in the layer, leading to obtaining a microcrystalline film. In certain embodiments according to the present invention, the drying-out of the film under conditions such that it dries out slower than it would do under deposition conditions, may take place until an optimum value is obtained for the absorption spectrum of the layer. e.g. an absorption spectrum appropriate for photovoltaic applications or a maximum absorption spectrum. The absorption spectrum of a layer is related to the micro-quality of the layer, e.g. the degree of alignment of molecules in the layer. Slow drying of the film may lead to a better micro-quality of the layer than in the case of fast drying or drying under deposition conditions, and therefore slow drying may lead to a higher or broader absorption spectrum as compared to fast drying or drying under deposition conditions. The drying scheme can for example be optimized to provide an appropriate light absorption spectrum of the organic active layer for photovoltaic applications or to induce an increase of the light absorption of an organic layer for photovoltaic applications in the longer wavelength range, being beneficial to the performance of the final solar cell. The optimum drying scheme may be determined experimentally.

Dissolving the active layer materials in appropriate solvents or solvent mixtures, i.e. solvents or solvent mixtures in which the active layer materials easily dissolve, in combination with a deposition technique such as linear casting or printing and controlling its parameters, can thereby make aforementioned additional treatments, such as for example a temperature treatment after the film has completely dried out, e.g. as disclosed in WO 2004/025746, obsolete. The application of the aforementioned annealing step followed by a slow drying step in accordance with the present invention can however still be combined with this method, without deteriorating the final result.

With organic material is meant a carbon containing material. The organic material used for producing a layer according to embodiments of the present invention can for example comprise materials which are electron acceptors and/or materials which are electron donors. The organic material may be a mix or a combination of electron acceptor and electron donor materials. The layer of organic material may be suitable for being used in solar cell applications, but may also be suitable for other devices, such as for example OLED transistors, lasers, phototransistors, photodetectors, optocouplers. The organic material should be a material suitable for the application aimed at. In embodiments of the present invention, the organic material may be soluble in tetraline (THN). The organic material may comprise or may be a conjugated polymer. It may comprise or be a regioregular material. A regioregular material is a material formed by a consistent repetition of a specific building block with the same directional orientation. Generally, for a material to be considered as regioregular no more than 3 percent, preferably no more than 1 percent of the building blocks should be in an orientation that differs from the orientation of the majority of the building blocks. The organic material may comprise or be a poly(thiophene). The organic material can further comprise fullerenes and/or fullerene derivatives. The organic material can further comprise conjugated additives. Conjugated additives can for example have an electrical function, e.g. providing electrical conductivity. The organic material can further comprise non-conjugated additives. Non-conjugated additives can have a function e.g. with regard to printing techniques. They can for instance be used to control the rheology, i.e. characteristics related to deformation and flow of the matter, as e.g. viscosity of the solution, or they can for instance be used to allow UV curing of the deposited solution. They can further affect the contact angle, affinity, drying, dilution and so on of the deposited layer.

The method according to the present invention is widely applicable to materials or material combinations that are suitable to be solution processed. For example, materials mentioned in "Organic Solar Cells: An Overview", Harald Hoppe and Niyazi Serdar Sariciftci, Journal of Materials Research, Vol. 19, Nr 7, July 2004, pp. 1924-1945, Chapter II, "Materials", have suitable properties for being applied in the methods according to the present invention. Examples of such suitable materials are:

- molecular materials, e.g. ZnPc (zinc-phthalocyanine), MePtcdi (N,N'-dimethyl-perylene-3,4,9,10-dicarboximide), $C_{60}$, pentacene, oligomeric thiophenes, derivatized compounds of these molecular materials;
- hole-conducting donor type polymers, e.g. MDMO-PPV (poly[2-methoxy-5-(3,7-dimethyloctyloxy)]-1,4-phenylene-vinylene), P3HT (poly(3-hexylthiophene-2,5-dixyl)), PFB (poly(9,9'-dioctylfluorene-co-bis-N,N'-(4-butylphenyl)-bis-N,N'-phenyl-1,4=phenylenediamine));
- electron-conducting acceptor polymers, e.g. CN-MEH-PPV (poly-[2-methoxy-5-(2'-ethylhexyloxy)-1,4-(1-cyanovinylene)-phenylene]), F8TB (poly(9,9'-dioctlyfluoreneco-benzothiadiazole)), a soluble derivative of $C_{60}$, namely PCBM (1-(3-methoxycarbonyl)propyl-1-phenyl[6,6]$C_{61}$).

All of these materials are solution processable due to their side-chain solubilization. The organic polymers can be, for example, polymers having a conjugated repeating unit, in particular polymers in which neighboring repeating units are bonded in a conjugated manner, such as polythiophenes, polyphenylenes, polythiophenevinylenes, poly(3-alkyl) thiophene, polyfluorenes, or poly-p-phenylenevinylenes or their families, copolymers, derivatives, or mixtures thereof. More specifically, the organic polymers can be, for example: polyfluorenes; poly-p-phenylenevinylenes, 2-, or 2,5-substituted poly-p-phenylenevinylenes; polyspiro polymers; or their families, copolymers, derivatives, or mixtures thereof. The organic polymers can for example include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, compositions including $C_{60}$, and compositions including derivatized $C_{60}$ may be used.

For the method of producing an organic layer according to embodiments of the present invention, solvents with a high boiling point are preferred, for example solvents with a boiling point higher than 61° C., 80° C., 100° C., 101° C., 110° C., higher than 150° C., or higher than 200° C. The higher the boiling point of the solvent, for a same temperature and atmosphere, the slower the evaporation and thus the drying out of the film will be. The solvent may for example comprise tetralin (with a boiling point of about 206° C.). The solvent can be a mixture of individual solvents. Individual solvents can comprise tetralin, tetrahydrofurane, xylene, toluene, chloroform, chlorobenzene or the like.

An aspect of the present invention is also to provide a method to control the viscosity of a solution comprising organic material or organic compounds dissolved in a solvent. The viscosity of the dissolved organic compounds in the solvent may be controlled via temperature, choice of solvent, stirring or in any other suitable way. In this way, a solution of an organic material, e.g. a photovoltaic active layer material dissolved in a solvent or solvent mixture can be made suitable for different linear casting or printing techniques. The aforementioned annealing step of the first aspect of the present invention to improve the film quality can also be applied to organic layers, e.g. photovoltaic active layers, resulting from a deposition of such viscosity controlled solutions. Solutions with controlled viscosity according to the second aspect of the present invention may be used with methods according to embodiments of the first aspect of the present invention.

In a preferred embodiment, the solution has a viscosity sufficiently high to prevent bleed through of the solution in a screen printing process, for example a viscosity higher than 0.5 Pa·s. The solution may for example be produced by dissolving the organic material in the solvent and waiting until the solution attains a viscosity sufficiently high to prevent bleed through of the solution in a screen printing process, for example a viscosity higher than 0.5 Pa·s. The ratio of weight of organic material per volume of solution (w/v) is preferably in the range between, as a bottom limit, 0.5% or 1% or 2% and, as a top limit, 5% or 6% or 7% or 8% or 9% or 10% or 15%.

The method according to embodiments of the present invention may for example be used for the production of an organic layer as part of a photovoltaic cell, a light-emitting diode, a photodetector, a transistor, a laser or a memory element.

Photovoltaic Application

The layer of organic material produced by a method according to embodiments of the present invention can advantageously be used for the production of a solar cell. Such a method for the production of a solar cell preferably comprises providing first electrodes on a substrate, providing on the substrate and the electrodes, under deposition conditions, a layer of solution comprising organic material dissolved in a solvent, annealing the layer of solution before the layer has been dried out completely and said annealing further being limited in time such that said layer is not dried out completely during annealing, thereafter controlling drying out of the layer so that drying is performed slower than it would be under deposition conditions; and providing second electrodes on top of the dried out layer of organic material.

More in particular, the method according to the present invention has been shown to be interesting for the deposition of active layers of organic solar cells based on polythiophenes like poly(3-hexyl thiophene). Dissolving this material in a high boiling point solvent like tetrahydronaphthalene (THN, tetraline, having a boiling point of about 206° C.) in a concentration corresponding to a weight per volume (w/v) percentage in the range between 1% and 5%, allows to deposit this solution onto a substrate by means of screen printing. However, the discontinuous nature of the process whereby the solution has to be pushed through separate holes of the screen to form a continuous layer in the end, as well as a possibly low viscosity of the solution results in an overall poor quality of the layer after evaporation of the solvent according to prior art methods.

If a temperature curing or annealing step e.g. at approximately 100° C., is performed in accordance with embodiments of the present invention, during a time sufficient to reflow the solution, but short enough such that the solution is not completely dried out, e.g. during about 2 seconds, after deposition of the solution onto the substrate, substantial improvement of the layer quality is obtained, both of the macro quality and the micro quality. The surface roughness of the film is reduced with at least 50%, the edge definition of the pattern is considerably better (at least 50% better), and on a micro-scale the film shows an improved alignment of molecules compared to conventional methods of applying such films. This is illustrated in FIG. 1 by digital scans of the layers processed without (FIG. 1(a)) or with (FIG. 1(b)) the annealing procedure according to embodiments of the present invention, after full evaporation of the solvent.

Similar results can be obtained for a solution of P3HT in THN in which also materials such as fullerene-derivatives are additionally dissolved. The material combination of P3HT and the fullerene-derivative PCBM in a solid state active layer is well-known to result in very good performing organic solar cells.

The regioregularity of polythiophenes, which accounts for the specific orientation of the side chains onto the polymer backbone, can result in a specific interaction (steric effect), e.g. alignment, of the separate polymer chains with each other. This can also occur in solution and it simply proceeds over time. The process can be monitored by a distinct redshift of the colour of the solution. It is accompanied by an increase of the viscosity of the solution over time. A viscosity level can thereby be obtained such that bleed through of the solution in a screen printing process can be prevented, e.g. a viscosity level higher than 0.5 Pa·s. This procedure makes the solution more suitable for processing with a technique like screen printing. The procedure can be reversed simply by heating the solution to obtain again the initial lower viscosity. This reversing of the effect results in a viscosity level of the solution that can be more suitable for other deposition techniques than screen printing. The reversing is accompanied by a disappearance of the red-shifted colour of the solution.

The application of the annealing step according to embodiments of the present invention on the deposited solution results in an improved layer quality of the photovoltaic active layer. The effect of the annealing procedure on the micro quality of the layer can, in the case of depositing the solution with a high viscosity level (e.g. a viscosity higher than 0.5 Pa·s), clearly be monitored by a colour change of the deposited layer. The red-shifted colour of the highly viscous solution disappears upon annealing of the deposited layer. This shows that, in accordance with embodiments of the present invention, indeed the procedure is applied when still a considerable amount of solvent is present in the as-deposited film. The colour change typically indicates an occurrence of an amorphous orientation of the polymer material in solution whereby the different polymer chains are no longer strongly interacting with each other. The full evaporation of the solvent afterwards in controlled conditions results in a solid film with improved layer quality of the photovoltaic active layer.

The possibility to restrict the annealing step to a short time interval makes it highly compatible with additional treatments of the photovoltaic layer to optimize the performance of the final photovoltaic device. However, dissolving the active layer materials in an appropriate solvent or solvent mixtures, in combination with a deposition technique like linear casting or printing and controlling its parameters, can thereby make some additional treatments obsolete, such as e.g. a temperature treatment after the film has completely dried out.

By controlling the evaporation speed or time of the solvent from the deposited layer, a broadening of the radiation absorption of the photovoltaic layer in the longer wavelength range can be induced. This also improves the layer quality. A slow evaporation speed yields thereby a strong broadening in the longer wavelength range, whereas a fast evaporation of the solvent results in a photovoltaic active layer with reduced absorption in the longer wavelength range. Besides state of the art techniques like, for example, controlling the ambient temperature or atmosphere, the evaporation time of the solvent or the drying speed of the solution can also be controlled by dissolving the active layer materials in an appropriate solvent or solvent mixture with an appropriate boiling point, i.e. preferably a high boiling point, such as for example a boiling point above 61, 80, 100, 101, 110, 150, 200 degrees Celcius, in combination with a deposition technique like linear casting or printing and controlling its deposition parameters such as e.g. deposition speed and pressure. Contrary to spin coating, in linear casting or printing techniques the evaporation of the solvent can be fully controlled by an appropriate choice of the solvent or solvent mixture in which the active layer materials are dissolved. The evaporation speed can thereby be lowered when using higher boiling point solvents or solvent mixtures. In this way, the increase of the absorption of the photovoltaic active layer in the longer wavelength range is controlled by the use of appropriate solvents or solvent mixtures in combination with the linear casting or printing technique.

Figure 2:
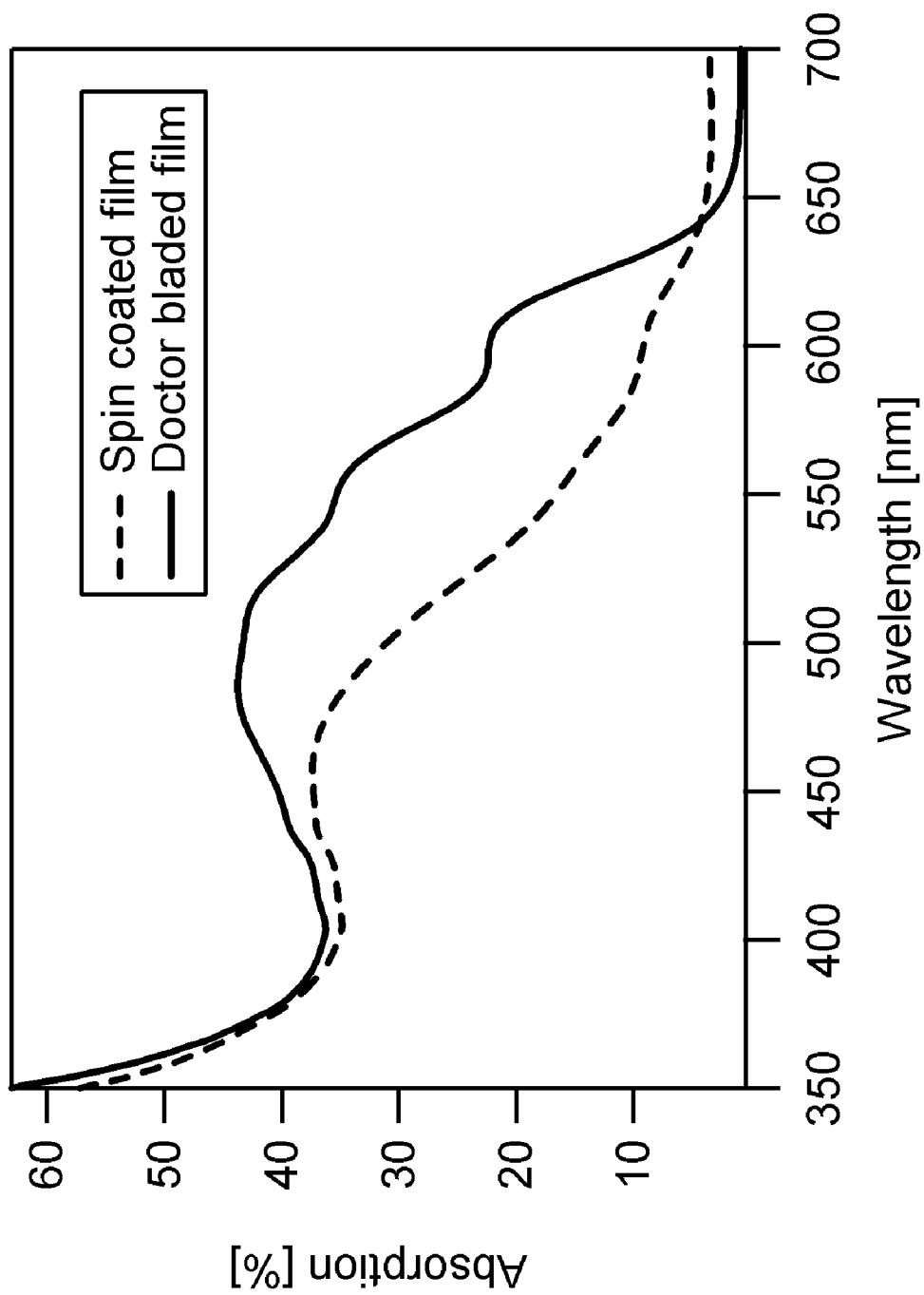
FIG. 2 shows optical absorption spectra (UltraViolet-Visual spectra) of a spin coated and a doctor bladed film containing a mixture of the regio-regular conjugated polymer P3HT and the molecule PCBM.

In the following example a comparison is made between films with a thickness of 150 nm, deposited by doctor blading, a linear casting technique, and same films deposited by spin coating, a rotation based technique. The deposition mixture contained a 1.5% (weight/volume) 1:2 weight ratio blend of the regioregular conjugated polymer P3HT and the molecule PCBM dissolved in orthodichlorobenzene+2.5% (volume %) tetrahydronaphtalene mixture, as used in solar cell devices. The spin coated film was deposited at 1000 rpm for 60s. The doctor bladed film was deposited at a blade speed of 80 mm/s. The UltraViolet-Visual (UV-Vis) spectrum of the as-produced active layer films is shown in FIG. 2. It has been reported in literature that a link exists between the UV-Vis absorption spectrum of this material system and the performance in organic solar cells. The film deposited by doctor blading shows the desired broader absorption band compared to the film deposited by spin coating. This may be attributed to the slower solvent evaporation in the case of the doctor-bladed film as compared to the spin coated film.

The application of linear casting techniques allows a good control of the solvent evaporation speed, as evaporation speed is dependent on e.g. ambient parameters which are better controllable with linear casting techniques than with spin-coating techniques. Linear casting techniques allow more process freedom, e.g. the temperature ranges suitable for spin-coating are smaller than for linear casting techniques. Furthermore, linear casting techniques allow reducing the evaporation speed when compared to spin-coating to produce the active layer of organic devices, e.g. containing regioregular conjugated polymers. This can result in a broadening of the absorption spectrum compared to rotation based casting techniques.

The described method is not restricted to the photovoltaic application mentioned but is relevant for many applications where thin films, i.e. films thinner than 1 micrometer, are to be deposited with a minor surface roughness and a high quality of line resolution and edge definition such as, for example, organic light-emitting diodes, photodetectors, transistors, lasers, memory elements.

The invention claimed is:

1. A method for producing a layer of organic material, the method comprising:

depositing on a substrate surface, under deposition conditions, a layer of a solution comprising an organic material dissolved in a solvent, wherein said deposition conditions comprise a deposition temperature, a deposition pressure, and a deposition atmosphere;

annealing said layer of solution, said annealing being applied before said layer of solution has been dried out completely, such that the solvent or a part of the solvent is still present in the layer, and a duration of said annealing being limited such that said layer of solution is not dried out completely during the annealing, said annealing inducing reflow of said layer of solution whereby the organic material is redistributed on the substrate surface; and thereafter drying out said layer of solution by substantially completely removing the solvent from the layer, said drying out being controlled by reducing an evaporation speed of the solvent, such that drying is performed slower than it would under the deposition conditions, wherein the evaporation speed of the solvent is reduced by changing one or more environmental parameters in a manner selected from the group consisting of lowering a drying temperature to below the deposition temperature, raising a drying pressure to above the deposition pressure, and raising an amount of the solvent in the drying atmosphere such that the drying atmosphere is saturated with the solvent.

2. The method according to claim 1, wherein annealing said layer of solution is performed at a temperature above said deposition temperature and below a boiling temperature of said solvent.

3. The method according to claim 1, wherein the duration of said annealing is from about 0.1 to about 60 seconds.

4. The method according to claim 1, wherein drying out said layer of solution is performed at said deposition temperature.

5. The method according to claim 1, wherein drying out said layer of solution is performed at a temperature of from about 20° C. to about 25° C.

6. The method according to claim 1, wherein the drying atmosphere is saturated with the solvent.

7. The method according to claim 1, wherein depositing a layer of a solution comprises depositing a solution with a viscosity higher than about 0.5 Pa·s on the substrate surface.

8. The method according to claim 1, wherein depositing a layer of a solution comprises dissolving said organic material in said solvent, waiting until said solution attains a viscosity higher than about 0.5 Pa·s, and applying said solution to the substrate surface.

9. The method according to claim 1, wherein depositing a layer of a solution comprises depositing a layer of a solution with a ratio of weight of organic material per volume of solution of from about 0.5% to about 15%.

10. The method according to claim 1, wherein depositing a layer of a solution comprises providing said layer by means of a linear technique.

11. The method according to claim 10, wherein said linear technique comprises at least one technique selected from the group consisting of a doctor-blading technique, a roll-casting technique, and a printing technique.

12. The method according to claim 1, further comprising, between the step of depositing a layer of a solution and the step of annealing the layer of solution, partially drying said layer of solution.

13. The method according to claim 1, wherein said organic material is a conjugated polymer.

14. The method according to claim 1, wherein said organic material is a regioregular material.

15. The method according to claim 1, wherein said organic material is a poly(thiophene).

16. The method according to claim 1, wherein said solution further comprises at least one of fullerenes and fullerene derivatives.

17. The method according to claim 1, wherein said solution further comprises conjugated additives.

18. The method according to claim 1, wherein said solution further comprises non-conjugated additives.

19. The method according to claim 1, wherein said solvent comprises tetralin.

20. The method according to claim 1, wherein said solvent is a mixture of solvents.

21. The method according to claim 1, wherein said substrate comprises first electrodes, the method further comprising, after drying out the layer of solution, providing second electrodes on top of said layer of organic material, wherein said layer of organic material is on top of said first electrodes.

22. The method according to claim 1, wherein the organic layer is part of a photovoltaic cell, a light-emitting diode, a photodetector, a transistor, a laser or a memory element.

23. The method according to claim 1, wherein a layer of the organic material is obtained having an improved micro-quality as determined by a high degree of alignment of molecules in the layer.

24. The method according to claim 23, wherein the layer of the organic material having an improved micro-quality is a microcrystalline film.

* * * * *